United States Patent [19]

Sato

[11] Patent Number: 4,561,773
[45] Date of Patent: Dec. 31, 1985

[54] PROJECTION EXPOSURE APPARATUS

[75] Inventor: Hiroshi Sato, Tokyo, Japan

[73] Assignee: Canon Kabushiki Kaisha, Tokyo, Japan

[21] Appl. No.: 710,936

[22] Filed: Mar. 13, 1985

Related U.S. Application Data

[63] Continuation of Ser. No. 550,633, Nov. 10, 1983, abandoned.

[30] Foreign Application Priority Data

Nov. 17, 1982 [JP] Japan ................... 57-202477

[51] Int. Cl.⁴ ................. G03B 27/52; G03B 27/70
[52] U.S. Cl. ............................ 355/43; 355/45; 355/53; 356/400
[58] Field of Search ............ 355/67, 43, 45, 53; 356/399–401, 125

[56] References Cited

U.S. PATENT DOCUMENTS

| | | | |
|---|---|---|---|
| 3,542,469 | 11/1970 | Hennings | 355/43 X |
| 4,097,142 | 6/1978 | Moutou et al. | 355/45 |
| 4,140,392 | 2/1979 | Lacombat et al. | 355/53 X |
| 4,153,371 | 5/1979 | Koizumi et al. | 356/400 |
| 4,295,735 | 10/1981 | Lacombat et al. | 355/43 |
| 4,422,755 | 12/1983 | Phillips | 355/45 X |
| 4,437,758 | 3/1984 | Suzuki | 355/53 X |
| 4,452,526 | 6/1984 | Johannsmeier et al. | 355/43 |
| 4,464,030 | 8/1984 | Gale et al. | 355/53 X |
| 4,473,293 | 9/1984 | Phillips | 355/53 |
| 4,492,459 | 1/1985 | Omata | 355/43 |

Primary Examiner—Richard A. Wintercorn
Attorney, Agent, or Firm—Fitzpatrick, Cella, Harper & Scinto

[57] ABSTRACT

In an apparatus wherein a first object having an information pattern and a second object for recording the information pattern thereon are aligned through a projection optical system and thereafter exposure is effected through the projection optical system, particularly, an apparatus wherein the position of the second object is changed and a plurality of exposures are effected, light for alignment and light for exposure differ in wavelength from each other and the relative positional relation among the first object, the second object and the projection optical system is made to differ during alignment and during exposure.

9 Claims, 3 Drawing Figures

PROJECTION EXPOSURE APPARATUS

BACKGROUND OF THE INVENTION

1. Field of the Invention

This application is a continuation of application Ser. No. 550,633, filed Nov. 10, 1983, now abandoned.

This invention relates to a projection exposure apparatus to be used for the manufacture of semiconductors or the like.

2. Description of the Prior Art

The tendency of the patterns of semiconductors, ICs, LSIs, VLSIs, etc. toward minuteness and higher integration is remarkable and the pattern line width of 1–1.5 μm is becoming dominant. What is required in copying with the tendency of the patterns toward minuteness and higher integration is the provision of an exposure apparatus which has a printing performance for enabling the printing of minute patterns of 1–1.5 μm and an alignment performance for accurately aligning the patterns at the accuracy of several fractions of the printing line width throughout a plurality of steps of the process and which will cause less defects to be created in wafers.

To meet these requirements, various apparatuses in which exposure is effected by a plurality of reduction projections with the position on the wafer changed (so-called steppers) have been developed. The steppers are generally classified into the following two types in accordance with the difference in the alignment system for achieving the alignment accuracy of several fractions of the printing pattern line width which is one of the principal performances:

1. The off-axis alignment type steppers; and
2. The TTL-on-axis alignment type steppers.

The off-axis alignment system is a system in which a wafer pattern is aligned relative to an alignment optical system fixed to the outside of a projection optical system without the intermediary of the projection optical system, whereafter the wafer is accurately moved to below the projection optical system, whereby the photo-mask pattern and the wafer pattern are aligned indirectly. The TTL-on-axis alignment system is a system in which the photo-mask pattern and the wafer pattern are observed at one time through the projection optical system and the two patterns are aligned directly.

Alignment accuracy of the order of 0.1–0.2 μm is required of the steppers, but the off-axis alignment system has many error factors attributable to the fact that the wafer pattern and the photo-mask pattern are aligned indirectly, and it cannot cope with the in-plane distortion of the wafer. For this reason, development of TTL-on-axis alignment type steppers in which the wafer pattern and the photo-mask pattern are aligned directly has been much desired for the purpose of improving the alignment accuracy.

The projection optical system of the stepper is comprised of a lens optical system and as the light source, use is made of g-line (435.8 nm), h-line (404.7 nm), i-line (365 nm) or the like of a super-high pressure mercury lamp. Now, aberration correction of the reduction projection lens optical system for the stepper can only be made with respect to two wavelengths or a single wavelength. To achieve a high resolving power of 1–1.5 μm, there is a problem that the expanse of the spectrum of g-line, h-line, i-line or the like causes reduction of the resolving power and therefore, as shown in FIG. 1 of the accompanying drawings, the gradient tan α of the chromatic aberration correction curve in the wavelength used must be a small value. Therefore, the wavelength used during exposure of the projection optical system for the stepper presently put into practical use is g-line single wavelength, h-line single wavelength, i-line single wavelength (365 nm) or g-line and h-line two wavelengths.

Thus, the stepper is limited in the wavelength used during exposure of the projection optical system for the purpose of minute pattern printing which is one of the principal performances. In the TTL-on-axis alignment system, alignment is effected through the projection optical system and therefore, the wavelength used during alignment is limited in the relation with chromatic aberration. Under such limitations, the steppers being developed at present realize the TTL-on-axis alignment by effecting alignment by the use of a light of the same wavelength as that of the light for exposure, or adding an additional optical system to the projection optical system to effect alignment by the use of a light of a wavelength different from that of the light for exposure, such as for example e-line.

However, the steppers of such TTL-on-axis alignment type suffer from the following problems:

1. Where alignment is effected by the use of the same wavelength as the exposure wavelength, it is difficult to obtain a sufficient detection output because the intensity of light of the super-high pressure mercury lamp is weak;

2. It is impossible to apply the presently practically used laser beam scan alignment system or the like using various powerful laser lights which is not limited by the exposure wavelength of the projection optical system and which is carried out on the basis of the off-axis alignment system; and 3. Where an additional optical system is added to the projection optical system, the position representation error of the additional optical system provides an alignment error.

SUMMARY OF THE INVENTION

It is an object of the present invention to provide a TTL-on-axis alingment type projection exposure apparatus using a light of a wavelength different from that of the light for exposure, particularly, a laser light.

It is another object of the present invention to provide a projection exposure apparatus which achieves alignment and exposure by the use of different wavelengths without substantially changing the construction of the projection optical system.

It is still another object of the present invention to provide a projection exposure apparatus in which a piezo element for moving a wafer for focusing serves also as a member for changing its position during alignment and during exposure, particularly, a projection exposure apparatus in which reduction exposure is effected a plurality of times at different positions of the wafer.

The invention will become fully apparent from the following detailed description thereof taken in conjunction with the accompanying drawings.

DESCRIPTION OF THE PREFERRED EMBODIMENT

Figure 1:
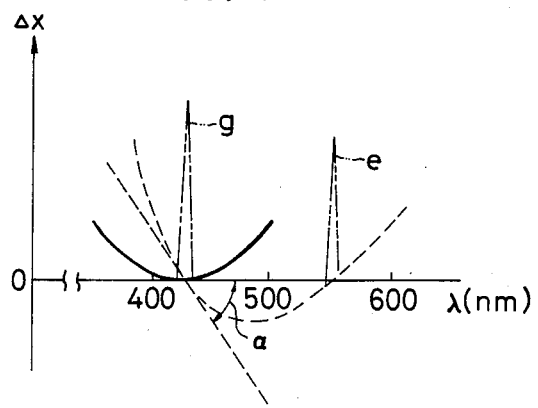
FIG. 1 is a graph showing the chromatic aberration correction curve of a projection optical system of g-line and e-line two wavelengths correction and g-line single wavelength correction.

FIG. 1 shows the chromatic aberration correction curve of a projection optical system. In FIG. 1, the abscissa represents wavelength (nm) and the ordinate represents out-of-focus Δx. Further, in FIG. 1, e and g represent the spectrum distributions of e-line and g-line. The broken line indicates the chromatic aberration correction curve of the projection optical system aberration-corrected by two wavelengths, i.e., printing light g-line and alignment light e-line, and the solid line indicates the chromatic aberration correction curve of the projection optical system aberration-corrected by g-line single wavelength.

In the case of the correction by two wavelengths, i.e., g-line and e-line, the inclination tan α of the curve for g-line is great, the out-of-focus by the expanse of g-line spectrum is great and the image contrast is reduced and therefore, this cannot be applied to a projection optical system of 1–1.5 μm for the stepper.

In the case of g-line single wavelength, tan α is smallest and the main current of the stepper being developed at present has mounted therein a projection optical system of g-line single wavelength.

Figure 2:
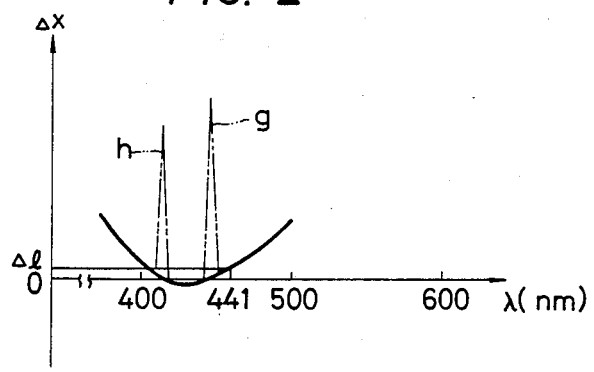
FIG. 2 is a graph showing the chromatic aberration correction curve of a projection optical system of g-line and h-line two wavelengths correction.

FIG. 2 shows the correction by two wavelengths, i.e., g-line and h-line. The wavelengths of g-line and h-line approximate each other and therefore, tan α is sufficiently small, and the influence of the standing wave in photoresist during printing is reduced by two-wavelength printing. Therefore, the printing performance in the stepped portion of a wafer is good, and a projection optical system corrected by two wavelengths, i.e., g-line and h-line, is more excellent in minute pattern printing performance. In FIG. 2, g and h represent the spectrum distributions of g-line and h-line.

Figure 3:
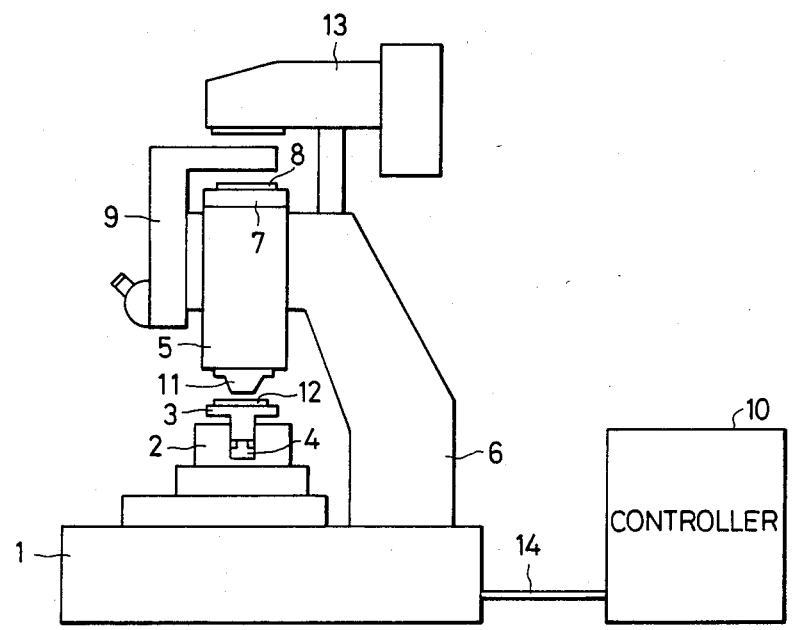
FIG. 3 schematically shows a projection exposure apparatus using the present invention.

FIG. 3 shows an embodiment of the projection exposure apparatus using the present invention. An XY stage 2 is mounted on a body base 1, and a wafer chuck 3 is mounted on the XY stage through a piezo 4 for auto focus driving. A projection optical system 5 is supported by a saddle 6, and a photo-mask 8 is set on top of the projection optical system with a photo-mask stage 7 interposed therebetween. In the present embodiment, the projection optical system 5 is aberration-corrected by the two wavelengths, i.e., g-line and h-line, shown in FIG. 2, and an He-Cd laser (wavelength 441 nm) approximate in wavelength to g-line is used as the alignment light source of an alignment optical system 9. As shown in FIG. 2, when light of 441 nm is passed through the projection optical system corrected by two-wavelengths, i.e., g-line and h-line, there is created an out-of-focus of the order of Δl=about 10 μm. In the present embodiment, this amount of out-of-focus Δl is strictly measured or known in advance in the optical design and is stored as an offset value in a controller 10. Where alignment is to be effected, the position of a wafer 12 is detected by a wafer position detecting air nozzle 11, the wafer 12 is positioned at the in-focus position for 441 nm by the piezo 4, and the photo-mask pattern and the wafer pattern are detected by the alignment optical system 9, whereby alignment is effected on the TTL-on-axis. After completion of the alignment and prior to the exposure by an illuminating optical system 13, the detected position command of the air nozzle is corrected by the offset value of Δl by the controller 10 through a cable 14, and power is applied to the piezo 4 of layered construction, whereby the wafer 12 is positioned at the in-focus position of g-line and h-line for exposure and thus, exposure is effected. At this time, there must not be positional deviations in directions X, Y and θ resulting from vertical movement of the wafer 12, but since Δl is a minute amount, it is mechanically easy to ensure a positional deviation of 0.1 μm or less corresponding to 1/100, for example, of the vertical movement of Δl=10 μm, and it is also easy to servo-correct the positional deviation resulting from the vertical movement by an electrical sensor or the like, not shown.

Likewise, it is the main current of the stepper being developed at present to actually measure the mutual position of the projection optical system and the wafer mounting portion by means of a laser interferometer in order to ensure the step accuracy and in this case, measurement of the positional deviation resulting from vertical movement of the wafer is already possible.

While the previous embodiment has been described with respect to the projection optical system aberration-corrected by g-line and h-line, the present invention can also be carried out with respect to a projection optical system aberration corrected by g-line single wavelength, h-line single wavelength, i-line single wavelength or the like. The alignment light source may also be an e-line or He-Ne laser having no sensitivity to photoresist.

In the embodiment, focusing is accomplished by vertically moving the wafer, but focusing may also be accomplished by vertically moving the projection optical system or the photo-mask.

The present invention has the following advantages:

1. TTL-on-axis alignment is possible by the use of other various laser lights than the printing wavelength, pattern detection of high output can be accomplished, and application of a laser beam scan auto alignment system or the like already established by a contact aligner or a mirror projection aligner is also possible; and 2. There is no necessity of adding an additional optical system and alignment of high accuracy is possible.

What I claim is:

1. A projection exposure apparatus having:
   a projection optical system for projecting an image of a first object onto a second object, said projection optical system forming different imaging positions by an alignment light and an exposure light;
   a laser light source emitting the alignment light;
   a light source for exposure emitting the exposure light different in wavelength from the alignment light; and
   means for changing the relative positional relation among said first object, said second object and said projection optical system when light is changed from the alignment light to the exposure light.

2. A projection exposure apparatus according to claim 1, wherein said projection optical system is aberration-corrected for at least two exposure lights of different wavelengths.

3. A projection exposure apparatus according to claim 1, wherein said laser light source is an He-Cd laser light source and said light source for exposure is a mercury lamp.

4. A projection exposure apparatus according to claim 1, wherein said means for changing the relative positional relation serves also as means for effecting focusing.

5. A projection exposure apparatus according to claim 4, wherein said means for changing the relative positional relation is a piezo element for displacing said second object in the direction of the optic axis.

6. A projection exposure apparatus according to claim 4, wherein said means for changing the relative positional relation is reciprocally moved in the direction of the optic axis during a plurality of exposures onto said second object.

7. A projection exposure apparatus comprising:
optical means which is aberration-corrected for light of a first wavelength and of a second wavelength;
transferring means for transferring an image of a first body onto a second body through said optical means with at least one of said light of the first wavelength and light of the second wavelength;
alignment means for effecting alignment between said first and second bodies through said optical means with light of a third wavelength which differs from the first wavelength and the second wavelength; and
adjusting means for adjusting the position of said second body along the direction of the optical axis of said optical means to mutually different positions between the times of the image transfer by said transferring means and alignment by said alignment means.

8. A projection exposure apparatus according to claim 7, wherein said adjusting means adjusts the position of said second body on the basis of an amount of deviation between in-focus positions of said optical means at the times of image transfer by said transferring means and alignment by said alignment means.

9. A projection exposure apparatus according to claim 8, wherein said alignment means includes a laser light source emitting laser light of the third wavelength.

* * * * *